United States Patent [19]
Kinugawa

[11] Patent Number: 6,069,067
[45] Date of Patent: May 30, 2000

[54] METHOD OF MANUFACTURING A SEMICONDUCTOR DEVICE

[75] Inventor: Masaaki Kinugawa, Tokyo, Japan

[73] Assignee: Kabushiki Kaisha Toshiba, Kawasaki, Japan

[21] Appl. No.: 09/299,149

[22] Filed: Apr. 26, 1999

Related U.S. Application Data

[62] Division of application No. 09/844,891, Apr. 22, 1997, Pat. No. 5,929,528.

[30] Foreign Application Priority Data

Apr. 22, 1996 [JP] Japan .................................. 8-100178

[51] Int. Cl.$^7$ ................................................ H01L 21/4763
[52] U.S. Cl. .......................... 438/622; 438/631; 438/666; 438/926
[58] Field of Search ..................................... 438/618, 622, 438/624, 626, 625, 926, 631, 666; 257/758, 775, 773

[56] References Cited

U.S. PATENT DOCUMENTS

| | | | |
|---|---|---|---|
| 5,239,201 | 8/1993 | Asano ...................................... | 247/758 |
| 5,281,555 | 1/1994 | Cho ......................................... | 438/625 |
| 5,459,093 | 10/1995 | Kuroda et al. .......................... | 438/599 |
| 5,659,202 | 8/1997 | Ashida ..................................... | 257/758 |
| 5,798,298 | 8/1998 | Yang et al. .............................. | 438/622 |
| 5,801,421 | 9/1998 | Sher et al. ................................ | 257/355 |
| 5,854,128 | 12/1998 | Ma et al. ................................. | 438/631 |
| 5,998,814 | 12/1999 | Yamaha et al. ......................... | 257/211 |

FOREIGN PATENT DOCUMENTS

| | | |
|---|---|---|
| 59-84552 | 5/1984 | Japan . |
| 60-187038 | 9/1985 | Japan . |
| 1-286332 | 11/1989 | Japan . |
| 4-162773 | 6/1992 | Japan . |
| 5-82517 | 4/1993 | Japan . |

*Primary Examiner*—T. N. Quach
*Attorney, Agent, or Firm*—Foley & Lardner

[57] ABSTRACT

The semiconductor of this invention is provided with a first inter-layer insulating film formed on the surface of a semiconductor substrate to a first film thickness; a plurality of first wiring patterns formed on the surface of the first inter-layer insulating film; a dummy pattern formed between the first wiring patterns and insulated electrically from the wiring patterns; a second inter-layer insulating film formed from the first inter-layer insulating film to a second film thickness so as to cover the surfaces of the first inter-layer insulating film, the first wiring patterns, the dummy pattern; and second wiring patterns formed on the surface of the second inter-layer insulating film and wherein the dummy pattern has no planar overlapped portion with respect to the second wiring patterns, that is, it is separated from the second wiring patterns in top view.

8 Claims, 6 Drawing Sheets

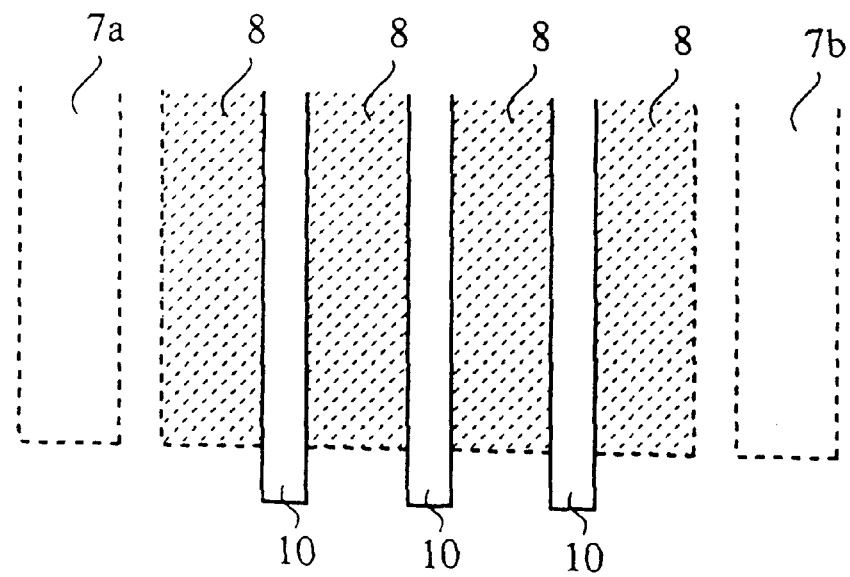
F I G. 4 (a)
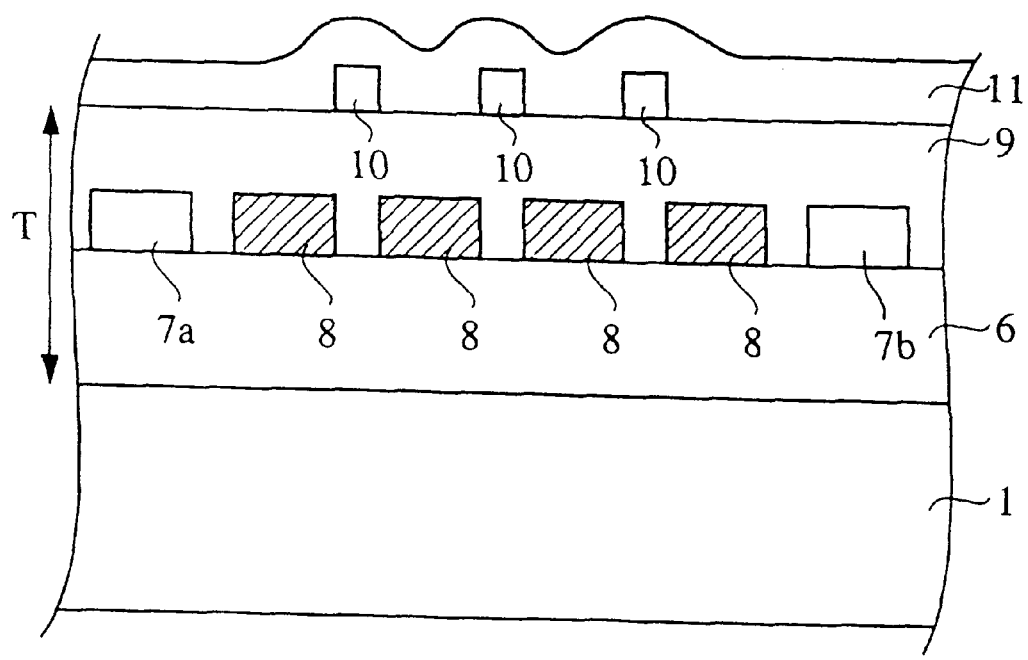
F I G. 4 (b)

METHOD OF MANUFACTURING A SEMICONDUCTOR DEVICE

This application is a divisional application Ser. No. 09/844,891, filed Apr. 22, 1997, U.S. Pat. No. 5,929,528.

BACKGROUND OF THE INVENTION

1. Field of the Invention

This invention relates to a semiconductor device having a multi-layer wiring structure and a method of manufacturing the same, with the method comprising the steps of forming a dummy pattern for flattening an interlayer insulating film and flattening the interlayer insulating film by a chemical mechanical polishing (CMP) method.

2. Description of the Related Art

FIG. 1 is a cross-sectional view of a semiconductor device for illustrating how an inter-layer insulating film formed on a semiconductor substrate is flattened by the CMP method.

A semiconductor substrate 1 is provided with elements (not shown) formed by ion implantation and diffusion of impurities; a first inter-layer insulating film 6 formed for covering the surfaces of those elements; contact holes (not shown) formed in the insulating film 6 and connected to the elements; first layer A1 wiring patterns 7a and 7b formed on the inter-layer insulating film 6; and a second inter-layer insulating film 9.

As shown in FIG. 1, since the first layer A1 wiring patterns 7a and 7b whose films are thick are arranged on the ground of the second inter-layer insulating film 9, the surface of the insulating film 9 becomes uneven. If the second layer A1 wiring is arranged on the uneven surface of the insulating film 9, then the lithographic accuracy for wiring patterning will lower, resulting in causing various problems such as the lowering of the wiring yield and electro-migration and the weakening the resistance against physical distortion.

To avoid such problems, the surface of the insulating layer 9 should be polished and flattened with a cloth 16 using the CMP method before the formation of an A1 film for forming the second layer A1 wiring patterns. In this case, the polishing is done for both the surface of the insulating film 9 covering the area where wiring patterns are formed sparsely around the wiring pattern 7a and the surface of the insulating film 9 covering the area where wiring patterns are formed densely around each of the wiring patterns 7b simultaneously.

In this case, however, the contact pressure between the cloth 16 and the surface of the insulating film 9 covering the wiring pattern 7a becomes larger than the contact pressure between the cloth 16 and the surface of the insulating film 9 covering the wiring patterns 7b, and consequently the cloth 16 is pressed excessively against the surface of the insulating film 9 covering the wiring pattern 7a, thereby increasing the polishing rate on that portion and impairing the flatness of the surface of the insulating film 9.

In addition, when the wiring patterns 7a and 7b are formed by reactive ion etching, the etching rate for the wiring material in the densely designed area of the wiring patterns becomes higher than that for the wiring material used in the sparsely designed area of the wiring patterns. This is because the density of etching ion is equal in every unit area and the wiring material must be removed much more by etching in an area where the wiring patterns are sparsely designed than an area where the wiring patterns are densely designed. Consequently, the above method makes the etching rate for the wiring patterns vary between the densely designed wiring patterns and the sparsely designed wiring patterns.

To solve these two problems, there is a well-known technique for improving the flattening of the insulating film formed on the wiring patterns and the accuracy of wiring pattern processing by arranging in the area around the sparsely arranged wiring pattern 7a, a dummy pattern(s) not electrically connected to the wiring patterns and other elements.

FIG. 2(a) and FIG. 2(b) are a top view and a cross-sectional view, respectively, of a semiconductor device in which a dummy pattern is arranged. As shown, the dummy pattern 8 is arranged between the two first layer A1 wiring patterns 7a and 7b formed in a sparsely formed wiring pattern area. With this dummy pattern 8, the surface of the second inter-layer insulating film 9 is flattened and the second layer A1 wiring patterns 10 can be processed finely to a high degree of accuracy on the surface of the insulating film 9. Furthermore, if the wiring patterns 7a and 7b, as well as the dummay pattern 8, are formed to a density substantially the same as that of the densely designed wiring pattern area, the wiring patterns 7a and 7b can be processed accurately without causing any irregularity in etching rate when using the reactive ion etching method.

By the way, it should be noted that the surface of the insulating film 11 for passivation of the second layer A1 wiring patterns is not required to be flattened since no wiring pattern is formed thereon.

As is well known, performance speed-up and high wiring integration of semiconductor devices have been in rapid progress of late. For such a semiconductor device, an increase in wiring capacitance is becoming the main factor of hindering the performance speed-up of the target semiconductor. Thus, when forming a dummy pattern in a semiconductor device having a multiple-layer wiring structure mentioned above, it is very important not to increase the total wiring capacitance of the multiple-layer wiring structure.

Now, let us consider the inter-wiring capacitance and the inter-substrate capacitance in the structure shown in FIG. 2(a) and FIG. 2(b).

For example, compared with the structure shown in FIG. 3(a), in which only an insulating layer 19 having a thickness of T1 exists between electrodes 20a and 20b that face each other to form a capacitance, the structure shown in FIG. 3(b), in which a dielectric layer having a thickness of T2 exists in the insulating layer 19 has a capacitance of T1/(T1−T2) times that of the former. In other words, if the dielectric layer is provided in the insulating layer, the capacitance is actually equal to the capacitance when the thickness obtained by subtracting the dielectric layer thickness from the insulating layer thickness is assumed as the dummy insulating layer thickness.

Consequently, if the two electrodes 20a and 20b facing, and connected to, each other electrically and the dielectric layer 21 in the insulating layer as shown in FIG. 3(b) are assumed as dummy patterns 8 not electrically connected to the ends of the two wiring patterns 7a and 7b formed in the same wiring pattern shown in FIG. 2(a) and FIG. 2(b), then how the dummy pattern will affect the inter-wiring capacitance 18 can be found from FIG. 3(a) and FIG. 3(b) equivalently. In the same way, if the two electrodes 20a and 20b and the dielectric layer 21 in the insulating layer are assumed as dummy patterns 8 not electrically connected to the bottom of the second layer wiring pattern 10 and the surface of the substrate 1, then how the dummy pattern will affect the substrate capacitance 17 can be found from FIG. 3(a) and FIG. 3(b) equivalently.

In other words, when considering how the dummy patterns 8 will affect the inter-wiring capacitance 18, the value obtained by subtracting the width of the dummy pattern 8 inside the two wiring patterns from the interval between the ends of the two wiring patterns 7a and 7b can be assumed as the dummy thickness of the insulating film corresponding to the capacitance between two wiring patterns when the dummy pattern exists between wiring patterns. Furthermore, if two or more dummy patterns whose widths are different from each other are formed between two wiring patterns, the value obtained by subtracting the sum of the widths of the dummy patterns from the interval between the two wiring patterns can be assumed as the dummy thickness of the insulating film corresponding to the capacitance between the two wiring patterns.

In the same way, when considering how the dummy pattern 8 will affect the capacitance 17 between wiring pattern and substrate, the value obtained by subtracting the film thickness of the internal dummy pattern 8 from the total film thickness of the inter-layer insulating films 6 and 9 formed between the surface of the substrate 1 and the wiring pattern 10 can be assumed as the dummy thickness of the insulating film corresponding to the inter-substrate capacitance when the dummy pattern exists between the wiring and the substrate.

As shown in FIG. 2(a) and FIG. 2(b), therefore, if a dummy pattern is provided in an area in which wiring patterns are formed sparsely, a dummy pattern will be found between the wiring pattern 10 and the semiconductor substrate 1, so the capacitance 17 between the second wiring pattern on the dummy pattern and the substrate 1 is increased. Furthermore, since a dummy pattern 8 exists between the wiring patterns 7a and 7b, the capacitance 18 between the wiring patterns 7a and 7b is also increased.

The influence of the element separating the insulating film formed on the semiconductor substrate 1 is not taken into consideration in the above explanation. The capacitance 17 formed between the wiring 10 and the substrate 1 drops according to the thickness of the element separating insulating film in the area where the element separating insulating film is formed. However, the element separating insulating film is not formed all over the area under the wiring 10. It would be an appropriate evaluation method not to take the element separating insulating film into account if more strict design standards are to be desired.

Furthermore, if a dummy pattern is arranged on a middle layer for wiring of two or more layers, the dummy pattern, strictly speaking, will also affect items other than the wiring patterns both above and under the dummy pattern. At this time, because of two or more existing thick insulating films between layers, the influence can be ignored.

On the basis of the above discussion, the object of this invention is to provide a semiconductor device that can speed up its performance and realize high integration of wiring without increasing the total wiring capacitance of the multiple-layer wiring structure mentioned above while keeping the accuracy of wiring pattern processing by using dummy pattern(s) to secure the flattening when polishing the surface of each inter-layer insulating film of the target multiple-layer wiring structure with the CMP method.

SUMMARY OF THE INVENTION

In order to achieve the above purpose, the semiconductor device having a multiple-layer wiring structure according to the first embodiment of this invention is provided with first inter-layer insulating film formed on a semiconductor substrate with first film thickness; two or more first wiring patterns formed on the surface of the first inter-layer film; a dummy pattern formed so that it may be insulated electrically from the first wiring patterns formed on the surface of the first inter-layer insulating film; second inter-layer insulating film formed from the first inter-layer insulating film with second film thickness, covering the surfaces of the first inter-layer insulating film, the first wiring patterns, and the dummy pattern respectively, and second layer wiring patterns formed on the surface of the second inter-layer film; wherein the dummy pattern is not overlapped with the second layer wiring patterns at all in the top view (separated in the top view).

The semiconductor device according to the second embodiment of this invention comprises an inter-layer insulating film formed on a semiconductor substrate; at least two first wiring patterns formed on the surface of the inter-layer insulating film at first interval; at least two second layer wiring patterns formed on the surface of the inter-layer insulating film at the minimum interval; and a dummy pattern formed at least in one area between the first wiring patterns so that it can be insulated electrically from those wiring patterns; wherein the distance obtained by subtracting the width of the dummy pattern from the first interval is larger than the minimum interval.

The manufacturing method of the semiconductor device according to the first embodiment of this invention comprises a process for forming the first inter-layer insulating film on the surface of the substrate with the first film thickness; a process for forming the first conductive film on the surface of the first inter-layer insulating film; a process for patterning the first conductive film and forming at least two first wiring patterns, and a dummy pattern between those two first wiring patterns; a process for forming the second inter-layer insulating film from the first inter-layer insulating film with the second film thickness, covering the surfaces of the first inter-layer insulating film, the first wiring patterns, and the dummy pattern respectively; a process for forming the second conductive film on the surface of the second inter-layer insulating film; and a process for patterning the second conductive film so that it may not overlap the dummy pattern at all in the top view (separated in the top view) to form the second wiring patterns.

The manufacturing method of the semiconductor device according to the second embodiment of this invention comprises a process for forming an inter-layer insulating film on a semiconductor substrate; a process for forming first conductive film on the surface of the inter-layer insulating film; and a process for patterning the first conductive film, forming at least two first wiring patterns at first interval, at least two second layer wiring patterns at the minimum interval, and a dummy pattern between the first wiring patterns; wherein the dummy pattern is formed so that the distance obtained by subtracting the width of the dummy pattern from the first interval may become larger than the minimum interval.

Consequently, applying the above semiconductor and the manufacturing method will be able to minimize the increase of the total wiring capacitance when a dummy pattern is arranged in a multiple-layer wiring structure, wherein one of the rules for arranging the dummy pattern(s) or a combination of the rules is applied for at least one wiring pattern except for that on the top layer of the structure, formed between the dummy pattern not connected electrically to the wiring pattern and a wiring pattern formed in the structure according to the required performance of the target semiconductor device.

Furthermore, since the multiple-layer wiring structure can be flattened with the CMP method, and at the same time, the increase of the wiring pattern parasitic capacitance and the lowering of the semiconductor device operating speed can be minimized, the manufacturing yield in the lithography process can be improved it is possible to provide a semiconductor with enhanced functions, high performance, and high reliability and to provide a manufacturing method for such semiconductor.

BRIEF DESCRIPTION OF THE DRAWINGS

FIGS. 4(a) and 4(b) are a top view and a cross sectional view, respectively, of a semiconductor device for explaining the first embodiment of this invention.

DETAILED DESCRIPTION OF THE PREFERRED EMBODIMENTS

Figure 1:
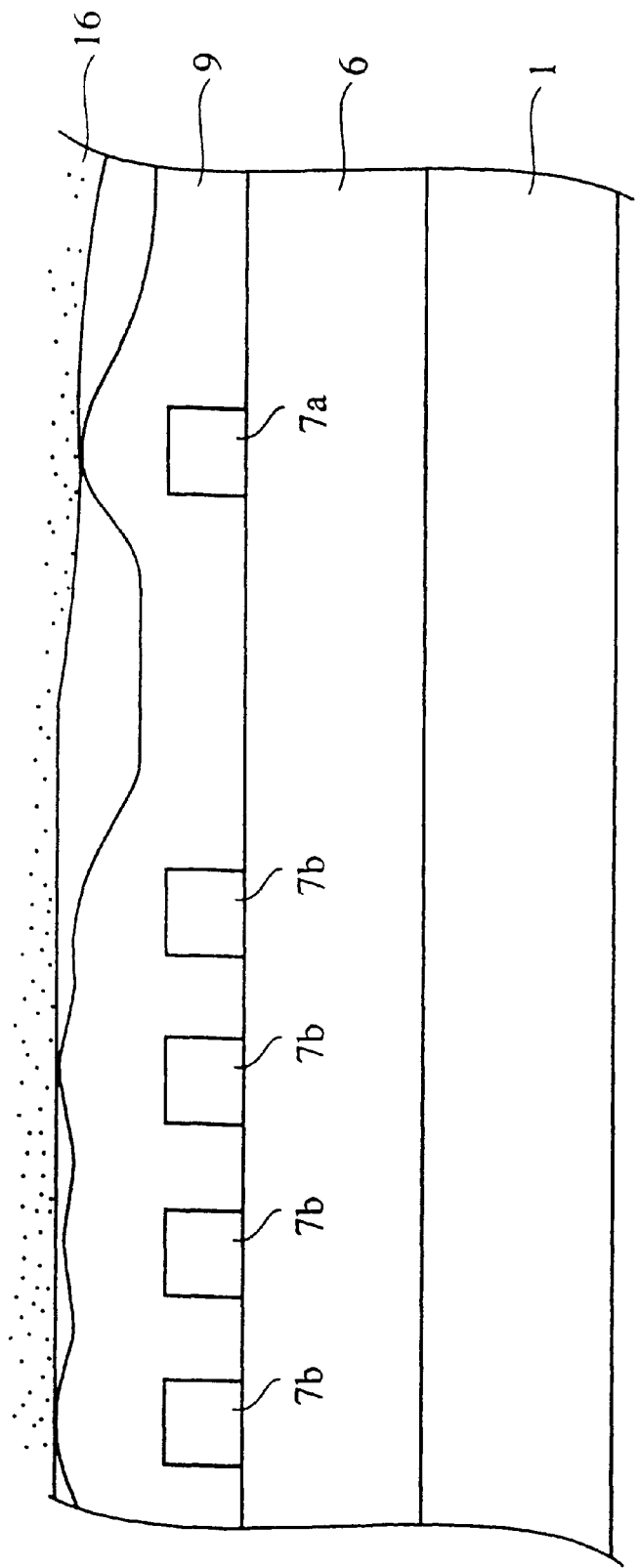
FIG. 1 is a cross section view for explaining how the CMP method is used in a flattening process of an inter-layer insulation film.

The first embodiment of this invention will be described with reference to FIG. 4(a) and FIG. 4(b). The semiconductor manufacturing method shown in the drawings is shown below.

At first, an interlayer insulating film 6 is formed on the surface of a semiconductor substrate 1 using the CVD method. Then, a wiring material of Al, polysilicon or the like is accumulated on the inter-layer insulating film 6 and the wiring material is patterned by a lithography process to form first wiring patterns 7a, 7b, and a dummy pattern 8. After this, an interlayer insulating film 9 is formed covering the surfaces of the wiring patterns, the dummy pattern, and the inter-layer insulating film 6 using the CVD method and the film surface is flattened with the CMP method. Then, a wiring material of Al, polysilicon, or the like that is accumulated on the flattened surface of the inter-layer insulating film 9 and patterned in a lithography process to form the second layer wiring patterns 10. And finally, a passivation film 11 is formed covering the surfaces of the wiring patterns 10 and the inter-layer insulating film 9.

The dummy pattern 8, since it is formed in an area in which wiring patterns are designed sparsely, contributes to the enhancement of the flatness of the surface of the inter-layer insulating film 9 between pattern 7a and 7b and to the processing accuracy of the wiring patterns 7a and 7b. Further, the dummy pattern 8 is not connected electrically to the substrate 1 and the wiring patterns 7a, 7b and 10 and the height thereof is the same as that of the wiring patterns 7a and 7b.

A feature of the first embodiment of this invention is that the first layer's dummy pattern 8 or each of the second layer wiring patterns 10 is formed so that it may not overlap the other in the top view. In other words, the dummy pattern 8 and the second layer wiring patterns 10 are formed so that the second layer wiring patterns 10 (or the dummy pattern 8) may not be arranged above the dummy pattern 8 (or under the second layer wiring patterns 10). In this specification, the relationship between the dummy pattern 8 and the second layer's wiring patterns 10 as mentioned above is described as "They do not overlap in the top view" or "There is a distance between them in the top view."

Figure 3:
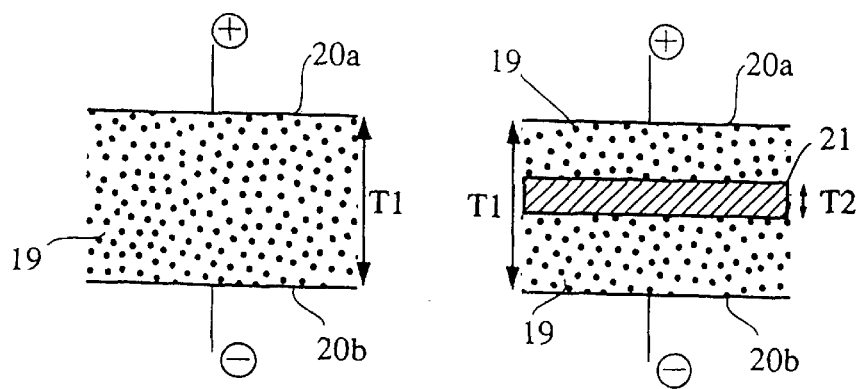
FIGS. 3(a) and 3(b) are cross sectional views of a flat-top capacitor for explaining the increase of the capacitance caused by the formation of a dummy pattern.

In the prior art, a dummy pattern was formed in an area in which the first layer wiring patterns were formed sparsely regardless of the capacitance, etc. formed between the second layer wiring patterns and the substrate whether or not the second layer wiring patterns are formed above the area. Consequently, this caused a problem that the capacitance formed between wiring pattern and substrate increases according to the film thickness of the dummy pattern formed between the second layer wiring patterns and the substrate as shown in FIG. 3(a) and FIG. 3(b). In the first embodiment of this invention, however, no dummy pattern 8 is formed between second layer Al wiring patterns and substrate, so such a problem as significant capacitance increase does not occur between wiring pattern and substrate.

Figure 5:
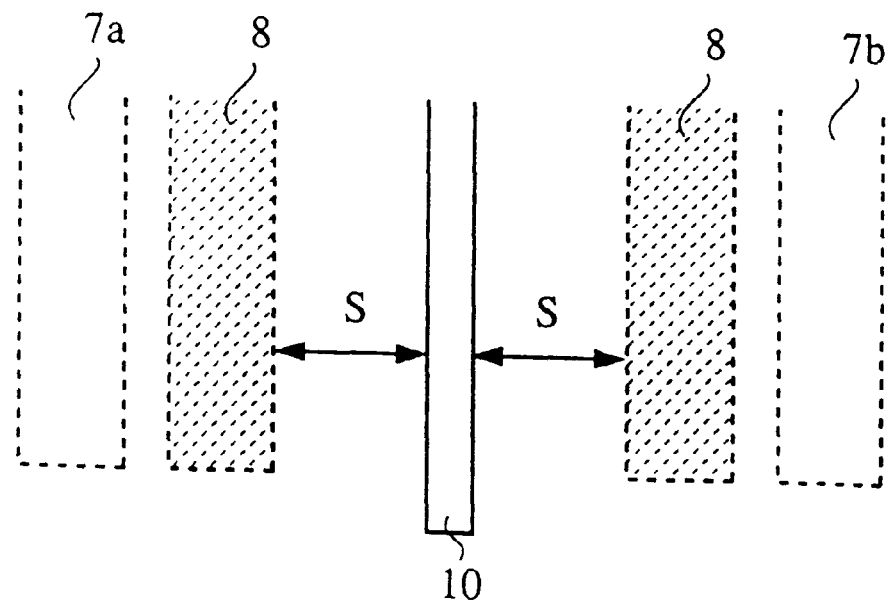
FIGS. 5(a) and 5(b) are a top view and a cross sectional view, respectively, of a more desirable semiconductor device for explaining the first embodiment of this invention.
Figure 5:
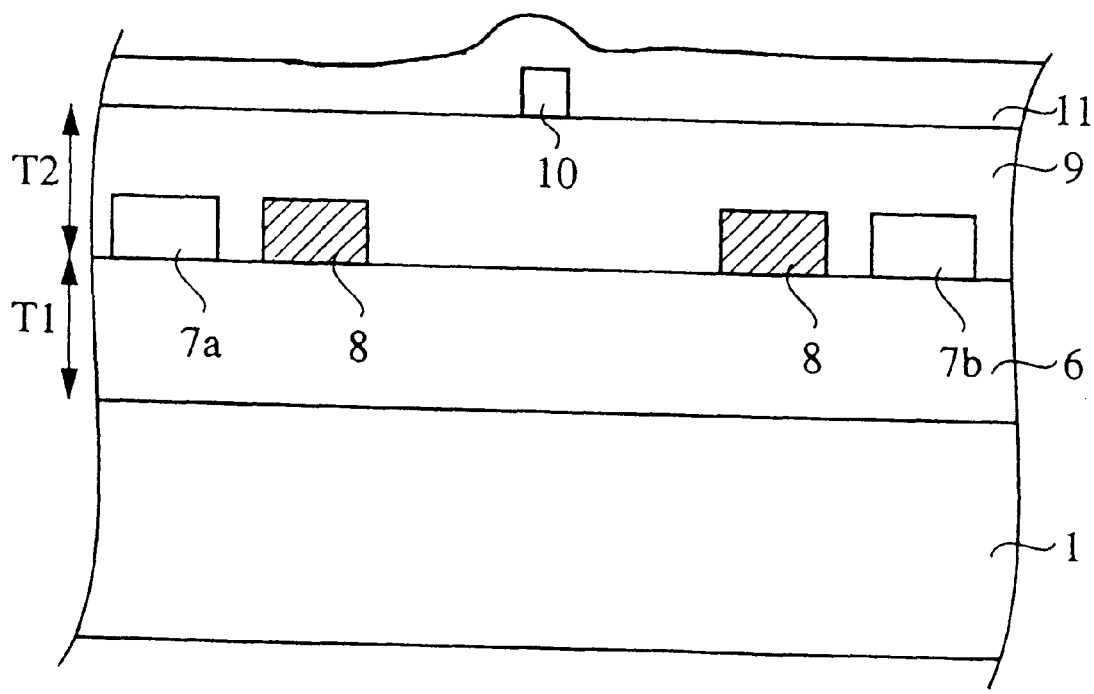

Subsequently, a more desirable model of the first embodiment of this invention will be described with the reference to the top and cross-sectional views shown in FIG. 5(a) and FIG. 5(b). In this description, the same items as those in the first embodiment described above will be given the same codes, avoiding redundant explanation.

As explained above, according to the first embodiment of this invention, the dummy pattern 8 and the second layer wiring patterns 10 are formed so that they may not overlap each other in the top view. In such configuration, however, the capacitance between wiring pattern and substrate increases due to the dummy pattern, and this cannot be prevented completely.

In other words, in order to reduce the effect of the second layer wiring patterns, the dummy pattern 8 and the second layer wiring patterns 10 should be formed so that the distance between them in the top view may become larger.

In other words, in order to eliminate most of the influence by the effect of second layer wiring patterns, the distance S between the dummy pattern 8 and the second layer wiring patterns 10 should be larger than the film thickness T2 of the second inter-layer insulating film 9. With this, the increase of the capacitance formed between wiring pattern and substrate, caused by the formation of the dummy pattern 8 and the effect of the second layer wiring patterns 10, will be minimized, so that it can be ignored.

If the distance S between the dummy pattern 8 and second layer wiring pattern 10 is separated by more than T2 (film thickness of the second layer wiring pattern 10), the capacitance between substrate and wiring pattern, caused by the formation of the dummy pattern 8, can be reduced furthermore. For example, if the distance S between the dummy pattern 8 and the second layer wiring pattern 10 in the top view is extended more than the sum of the first inter-layer insulating film thickness T1 and T2, the effect is further improved. In this case, however, since the dummy pattern 8 is formed to improve the flattening of each inter-layer insulating film formed above the dummy pattern 8 and the processing accuracy of the wiring patterns, the dummy pattern must be formed without damaging those effects. The increase of the capacitance between substrate and the wiring pattern, caused by the formation of the dummy pattern 8, can also be suppressed even when the distance S between the dummy pattern 8 and the second layer wiring pattern 10 in the top view is shorter than the second inter-layer insulation film thickness T2, however.

In the first embodiment, explanation was made with respect to a two-layer wiring structure but the same rule can also apply to other multiple-layer wiring structures with three or more layers. For example, if, when a dummy pattern is formed on a middle layer of a multiple-layer wiring structure comprising over three layers, the dummy pattern is formed so that it may not overlap the wiring pattern just above it in the top view, then the increase of the capacitance formed between the wiring patterns just above and just under the dummy pattern, caused by the formation of the dummy pattern, will be suppressed.

More preferably, the distance S between the dummy pattern 8 and the second layer wiring pattern just above the dummy pattern 8 in the top view should be larger than the thickness of the insulating film formed between the dummy pattern 8 and the wiring pattern just above it. Furthermore, preferably, the distance between the dummy pattern and the wiring pattern in the top view should be separated according to the thickness of the inter-layer insulating film formed under the wiring pattern.

Figure 6:
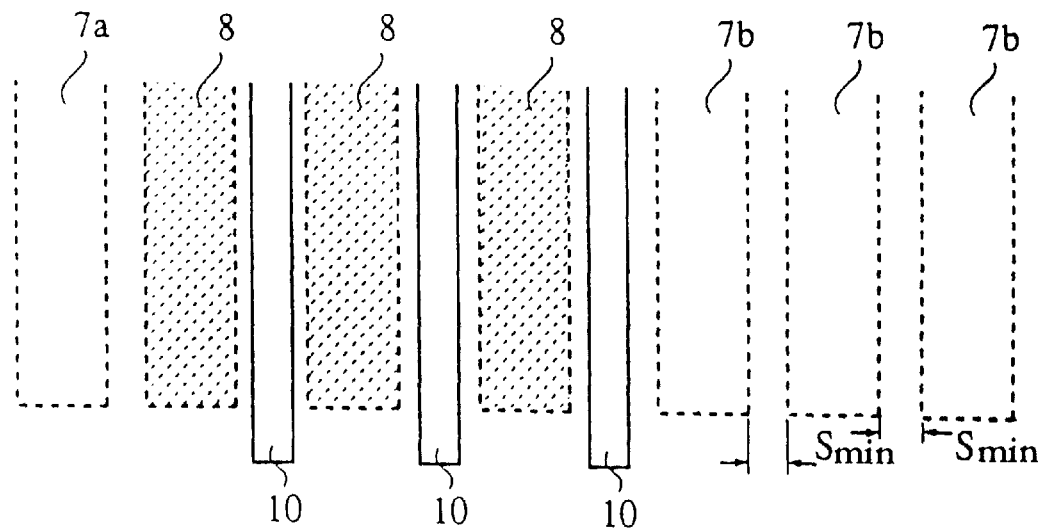
FIGS. 6(a) and 6(b) are a top view and a cross sectional view, respectively, of a semiconductor device for explaining the second embodiment of this invention.
Figure 6:
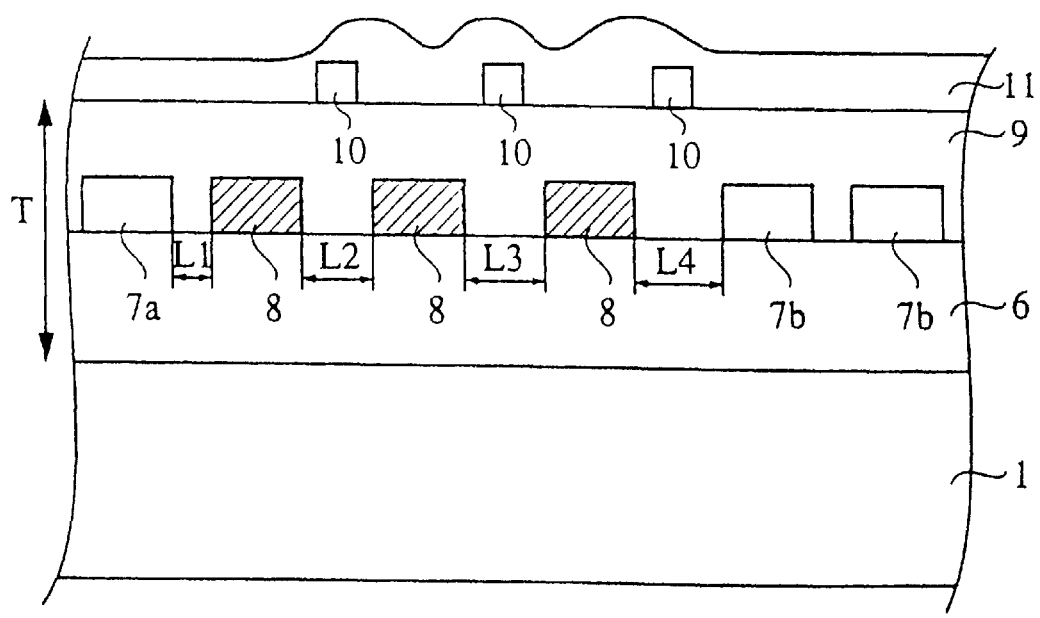

Subsequently, the second embodiment of this invention will be described with the reference to the top and cross section views shown in FIG. 6(*a*) and FIG. 6(*b*). In this explanation, the same items as those in the first embodiment will be given the same codes, avoiding redundant explanation.

Figure 2:
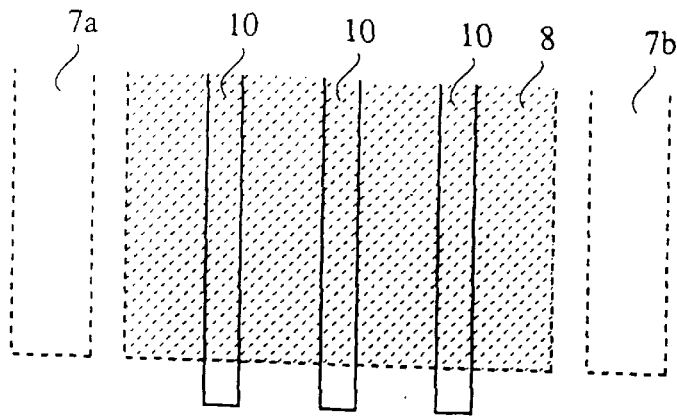
FIGS. 2(a) and 2(b) are a top view and a cross-sectional view of an area in which a prior art dummy pattern is formed.
Figure 2:
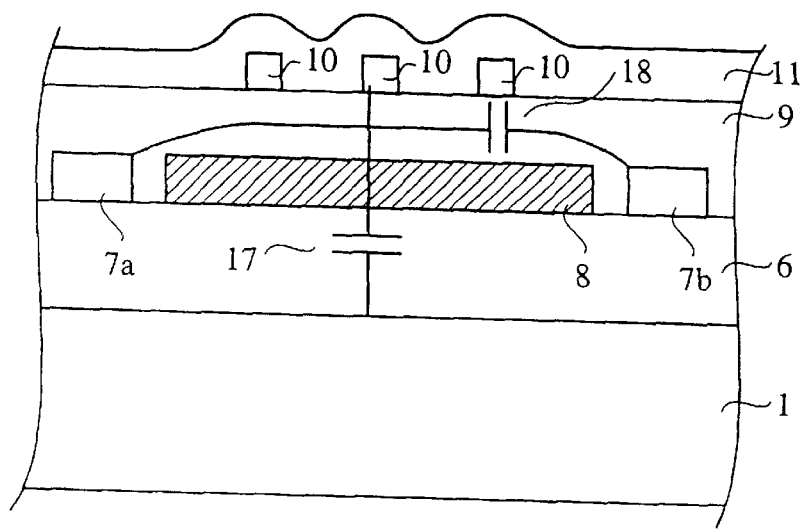

In the prior art shown in FIG. 2(*a*) and FIG. 2(*b*), two or more dummy patterns 8 are formed between first layer wiring patterns 7a and 7b. Because of this structure, the capacitance formed between the wiring patterns 7a and 7b increases according to the value obtained by subtracting the width of a dummy pattern from the thickness of the inter-layer insulating film formed between the wiring patterns 7a and 7b.

To avoid this problem, therefore, the value L (total (L1+ . . . L4) if two or more dummy patterns are formed) obtained by subtracting the width of the dummy pattern 8 of from the distance between the first layer wiring patterns 7a and 7b must be set larger than the specified value S min (the minimum interval between wiring patterns). In other words, designing a semiconductor device, for example, designing of semiconductor elements must be made under a design rule that the distance between wiring patterns must be more than a certain value. Under the design rule, the minimum inter-wiring distance between wiring patterns on the same layer is defined as S min, and the capacitance assumes the default value C max., which is decided by this minimum inter-wiring distance S min. Consequently, if elements of a semiconductor are designed so that the value L may become larger than this S min, this default value C max. is never be exceeded. Thus, the increase of the capacitance between substrate and wiring pattern, caused by the formation of the dummy pattern, can be much reduced. Consequently, the influence of the inter-wiring capacitance on the sum of all the inter-wiring capacitances can also be much reduced.

In order to further reduce the influence of dummy pattern forming on the inter-wiring capacitance, when the thickness of the first inter-layer insulating film is set to T1, the value L should be over T1 and the value L should be set over the minimum inter-wiring distance S min as shown above.

In this case, the capacitance formed between wiring patterns 7a and 7b can be reduced much more than the capacitance formed between wiring pattern 7a or 7b and the substrate. Consequently, the influence of the sum of all the wiring capacitances (capacitance between wiring patterns+ capacitance between wiring pattern and substrate) caused by the formation of the dummy pattern can be reduced, so that it can be ignored. If another wiring pattern is formed under the wiring patterns 7a and 7b, the capacitance formed between upper layer wiring and lower layer wiring becomes the same as above.

The first and second embodiments described above can also be used together to manufacture the semiconductor of this invention. In other words if the above two embodiments are used together, the capacitance formed between the second layer wiring patterns and the substrate, as well as the capacitance formed between wiring patterns on the dummy pattern formed layer and the capacitance between substrate and another wiring pattern, caused by the formation of the dummy pattern, can be suppressed.

Subsequently, the first and second embodiments of this invention will be described more concretely as the third embodiment with the reference to FIG. 7.

Figure 7:
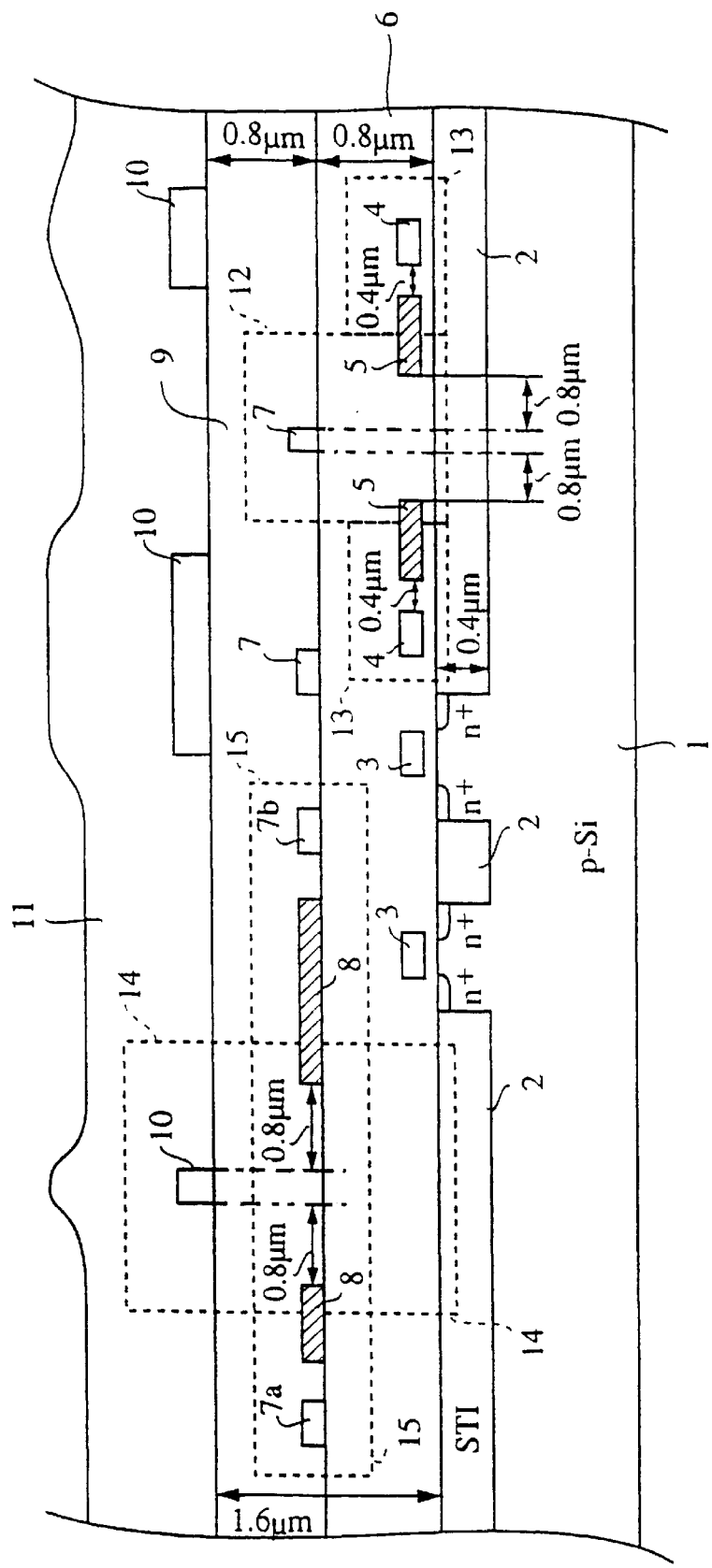
FIG. 7 is a cross sectional view of a semiconductor device for explaining the third embodiment of this invention.

FIG. 7 is a cross section view of a semiconductor device having a multiple-layer wiring structure comprising a polysilicon wiring layer and two Al wiring layers. The manufacturing method of the semiconductor is as shown below. At first, an element separating area 2 is formed using the STI (Shallow Trench Isolation) method on a P-type silicon substrate 1 having a film thickness of 650 $\mu$m. In the area 2, an oxidized film is embedded in a 0.4 $\mu$m deep groove. The STI method can flatten the surface of the element separating insulating film 2 just like the surface of the silicon substrate 1. Of course, the element separating insulating film 2 may be formed with the LOCOS (Local Oxidation of Silicon) method.

Subsequently, ion implantation is performed for the surface of the silicon substrate 1 to form a MOSFET to adjust the voltage to the threshold value of the MOSFET. Then, a 10 nm thick gate insulating film is formed with the thermal oxidation method. After this, a 400 nm thick polysilicon film is formed on the gate insulating film with the LP-CVD (Low Pressure-Channel Vapor Deposition) method and the polysilicon film is doped into an N-type one by phosphorus dispersion to form gate electrodes 3, polysilicon wiring patterns 4, and dummy patterns 5 on the MOSFET. The positions, sizes, etc. to form the dummy patterns 5 will be described later.

Subsequently, the gate electrodes 3, the element separating insulating film 2, etc. are used as masks for ion implantation of As, etc., and heat treatment of activation is performed as usually in the source and drain areas of the MOSFET to form an n+layer. Then, an insulating film is formed with the CVD method on the first polysilicon wiring layer comprising gate electrodes 3, polysilicon wiring patterns 4, and dummy patterns 5 and flattened with the CMP method to form a 0.8 $\mu$m thick inter-layer insulating film 6. After this, contact holes (not shown here) are formed in the inter-layer insulating film 6 and a 400 nm thick Al layer is formed on the inter-layer insulating film 6 with the spattering method to form the first Al wiring layer. Then, after a lithography process performing etching with resist, the first layer Al wiring patterns 7, 7a, 7b, dummy patterns 8 are formed. Positions and sizes to form the dummy patterns will be described later.

Subsequently, an insulating film is formed on the first Al wiring pattern comprising Al wiring patterns 7, 7a, 7b, and dummy patterns 8 that use the first A1 layer. The film is then flattened with the CMP method to form a 0.8 μm thick inter-layer insulating film 9.

After this, contact holes (not shown here) are formed in the inter-layer insulating film 9 and an A1 layer is formed on the insulating layer 9 with the spattering method. Then, second layer A1 wiring patterns 10 are formed to form a passivation insulating film 11 after a lithography process for etching with resist. Finally, bonding pads, etc. (not shown here) are formed to complete the manufacturing of the semiconductor.

Subsequently, positions and sizes for forming the dummy patterns, particular to this invention, will be described.

Dummy patterns 5 are formed to improve the flattening of the surface of the inter-layer insulating film 6 and the processing accuracy of gate electrodes 3 and wiring patterns 4. In order to suppress as much as possible the increase of the capacitance between substrate and wiring pattern, caused by the forming of dummy patterns, positions of those dummy patterns are decided according to the rules explained in the first and second embodiments and taking the relationship with the wiring patterns formed on the above wiring pattern into consideration.

In other words, as shown with a broken line 12 in FIG. 7, if the first A1 wiring pattern 7 exists over the dummy patterns 5, each comprising a polysilicon layer, the first embodiment rule is applied to suppress the increase of the substrate-wiring pattern capacitance of the A1 wiring pattern 7 caused by the dummy patterns 5. In this embodiment, the rule mentioned in the latter half of the first embodiment, which can suppress the increase of such substrate-wiring pattern capacitance more significantly, is applied and a dummy pattern is arranged so that the distance between the A1 wiring pattern 7 and the dummy patterns 5 in the top view may become 0.8 μm, which is the thickness of the first inter-layer insulating film.

Furthermore, as shown with a broken line 13 in FIG. 7, an embedded insulating layer 2 of the STI element separating area is formed on the silicon substrate, so the insulating layer 2 affects the substrate-wiring pattern capacitance of the first layer A1 wiring pattern in a close examination, but actually, the influence is small, since a thick insulating layer 6 is formed between the first layer A1 wiring pattern 7 and the substrate 1, and no element separating insulating film is formed in the entire area in the lower portion of wiring patterns. This would be a proper evaluation method from a point of view for seeking more strict design standards.

Furthermore, just like the lowest polysilicon wiring patterns 4, polysilicon wiring patterns 4 are formed on the embedded insulating layer 2 of the STI element separating area so that the wiring patterns may also be used as gates. If a dummy pattern 5 is formed adjacent to a polysilicon wiring pattern 4, the rule mentioned in the latter half of the second embodiment is applied. In other words, as shown with a broken line 13 in FIG. 7, a dummy pattern 5 is arranged so that the value obtained by subtracting the sum of the widths of the dummy patterns 5 from the distance between ends of wiring patterns 4 may become over 0.4 μm, which is the thickness of the element separating insulating film. In this embodiment, since the interval between wiring pattern 4 and dummy pattern 5 is 0.4 μm, this condition is already satisfied.

Just like the dummy patterns 5, the dummy patterns 8 are also formed to improve the flatness of the surface of the inter-layer insulating film 9 and to improve the processing accuracy of the wiring patterns 7a and 7b. At this time, to suppress the increase of the wiring pattern parasitic capacitance as much as possible, this arrangement is decided in consideration of the relationship with the wiring pattern formed on the upper wiring pattern according to the rule mentioned in the first and second embodiments.

In other words, as shown with a broken line 14 in FIG. 7, since the second layer A1 wiring pattern 10 exists over the dummy patterns 8, each comprising the first layer A1, the rule mentioned in the latter half of the first embodiment is applied to suppress the increase of the substrate-wiring pattern capacitance of the second layer A1 wiring pattern 10 caused by the existence of the first layer A1 dummy patterns 8. The dummy patterns 8 are arranged so that the distance between the second layer A1 wiring pattern 10 and each of the first layer A1 dummy patterns 8 in the top view may become over 0.8 μm, which is the thickness of the inter-layer insulating film 9 formed over the dummy patterns 8.

In a case shown with a broken line 14 in FIG. 7, since an embedded insulating layer 2 of the element separating area is formed on the silicon substrate, the insulating layer 2 affects the substrate-wiring layer capacitance shown by the second layer A1 wiring pattern 10 in a close examination, but actually two thick insulating layers 6 and 9 exist between the second layer A1 wiring pattern 10 and the silicon substrate 1, so the influence of the STI embedded insulating layer can be ignored just like in the broken line portion 12 in FIG. 7.

Furthermore, in order to suppress the increase of the capacitance between the first layer A1 wiring patterns 7a and 7b caused by the first layer A1 dummy pattern 8, the rule mentioned in the latter half of the second embodiment is applied. In other words, as shown with a broken line 15 in FIG. 7, when two dummy patterns 8 are arranged between the first layer A1 wiring patterns 7a and 7b, the first layer A1 dummy patterns are arranged so that the value obtained by subtracting the sum of the widths of the two dummy patterns 8 from the distance between the ends of the first layer A1 wiring patterns 7a and 7b may become over 0.8 μm, which is the thickness of the insulating film formed between the bottom of the first layer A1 and the surface of the silicon substrate. In a case shown with a broken line 15 in FIG. 7, the distance between two dummy pat-terns is over 1.6 μm, so this condition is already satisfied.

This invention can apply not only to the above embodiments, but also to CMP polishing, as well as to all etching-back processes that depend on patterns. Furthermore, the above explanations were only for one-layer polysilicon wiring and two-layer A1 wiring, but they can also apply to other multiple-layer wiring patterns formed by any materials.

According to the semiconductor device of this invention, wiring and substrate capacitances can be suppressed more than those of the prior art to arrange dummy pattern(s) in the target multiple-layer wiring structure. Thus, each wiring pattern in such a multiple-layer wiring structure can be flattened with the CMP method without damaging the high speed performance of the semiconductor device. Furthermore, this invention is also effective to improve the manufacturing yield in the lithography process significantly, enabling semiconductors with higher integration and reliability to be manufactured.

Furthermore, when the rules of this invention for arranging dummy pattern(s) are programmed for automatic arranging/wiring of semiconductors having a multiple-layer wiring structure, designing of high speed and high function semiconductors can be made more economically within a short turn-around time as has conventionally been done.

What is claimed is:

1. A semiconductor device manufacturing method comprising the steps of:
    forming a first inter-layer insulating film on the surface of a semiconductor substrate to a first film thickness;
    forming a first conductive film on the surface of said first inter-layer insulating film;
    patterning said first conductive film to form at least two first wiring patterns, and a dummy pattern between said two first wiring patterns;
    forming a second inter-layer insulating film from said first inter-layer insulating film to a second film thickness so as to cover the surfaces of said first inter-layer insulating film, said first wiring patterns and said dummy pattern;
    forming a second conductive film on the surface of said second inter-layer insulating film; and
    forming second wiring patterns by patterning said second conductive film in such a manner that said second conductive film does not have a planar overlapped portion with respect to said dummy pattern.

2. A semiconductor device manufacturing method as defined in claim 1, wherein said dummy pattern is separated from said second wiring patterns by at least a distance larger than the second film thickness of said second inter-layer insulating film in top view.

3. A semiconductor device manufacturing method as defined in claim 1, wherein said dummy pattern is separated from said second wiring patterns by at least a distance larger than the sum of the film thickness of said first inter-layer insulating film and the film thickness of said second inter-layer insulating film.

4. A semiconductor device manufacturing method as defined in claim 1, wherein said dummy pattern is separated from said second wiring patterns in top view by at least a distance larger than the distance between the surface of said semiconductor substrate and the bottom of said second inter-layer insulating film.

5. A semiconductor device manufacturing method comprising the steps of:
    forming an inter-layer insulating film on the surface of a semiconductor substrate;
    forming a first conductive film on the surface of said inter-layer insulating film; and
    patterning said first conductive film so that at least two first wiring patterns are formed leaving a first interval therebetween, at least two second wiring patterns are formed leaving a minimum interval therebetween and a dummy pattern is formed between said first wiring patterns, wherein said dummy pattern is formed so that a distance obtained by subtracting the width of said dummy pattern from said first interval is larger than said minimum interval.

6. A semiconductor device manufacturing method as defined in claim 5, wherein a plurality of said dummy patterns are formed at least in one of the areas between said first wiring patterns, and a distance obtained by subtracting the sum of the widths of said dummy patterns from said first interval is larger than said minimum interval.

7. A semiconductor device manufacturing method as defined in claim 6, wherein a distance obtained by subtracting the sum of the widths of said plurality of dummy patterns from said first interval is larger than the thickness of said inter-layer insulating film.

8. A semiconductor device manufacturing method as defined in claim 5, wherein a distance obtained by subtracting the width of said dummy pattern from said first interval is larger than the thickness of said inter-layer insulating film.

* * * * *